(12) United States Patent
Prakash (10) Patent No.: US 7,803,254 B2
(45) Date of Patent: Sep. 28, 2010

(54) PROCESSES FOR FORMING ELECTRONIC DEVICES AND ELECTRONIC DEVICES FORMED BY SUCH PROCESSES

(75) Inventor: Shiva Prakash, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 1058 days.

(21) Appl. No.: 11/070,070

(22) Filed: Mar. 2, 2005

(65) Prior Publication Data

US 2006/0144694 A1 Jul. 6, 2006

Related U.S. Application Data

(60) Provisional application No. 60/640,473, filed on Dec. 30, 2004.

(51) Int. Cl.
| | |
|---|---|
| H01L 31/12 | (2006.01) |
| H01L 29/16 | (2006.01) |
| C23C 14/00 | (2006.01) |
| C23C 14/32 | (2006.01) |

(52) U.S. Cl. .............. 204/192.11; 204/192.12; 204/192.14; 257/82; 315/169.3

(58) Field of Classification Search ............ 204/192.11, 204/192.12, 192.14; 257/82; 315/169.3
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,128,587 A * | 7/1992 | Skotheim et al. ............ | 313/504 |
| 5,247,190 A | 9/1993 | Friend et al. | |
| 5,317,169 A | 5/1994 | Nakano et al. | |
| 5,408,109 A | 4/1995 | Heeger et al. | |
| 5,674,368 A * | 10/1997 | Hashimoto et al. ..... | 204/298.25 |
| 6,488,555 B2 | 12/2002 | Pichler et al. | |
| 6,559,593 B1 | 5/2003 | Heeks et al. | |
| 6,726,812 B1 | 4/2004 | Toyama | |
| 2003/0144487 A1* | 7/2003 | Grushin et al. ................. | 534/15 |

FOREIGN PATENT DOCUMENTS

| | | | |
|---|---|---|---|
| JP | 07-113173 | * | 2/1995 |
| JP | 07113173 A | * | 5/1995 |

* cited by examiner

*Primary Examiner*—Nadine G Norton
*Assistant Examiner*—Mahmoud Dahimene
(74) *Attorney, Agent, or Firm*—John H. Lamming (57) ABSTRACT

A process for forming an electronic device includes forming a first layer over a substrate, wherein the first layer includes an organic layer, and depositing a second layer over the substrate after forming the first layer, wherein depositing the second layer is performed using ion beam sputtering. In another embodiment, a process for forming an electronic device includes placing a workpiece within a depositing chamber of a depositing apparatus, wherein the workpiece includes a substrate and an organic layer overlying the workpiece. The process includes generating a plasma within a plasma-generating chamber of the depositing apparatus, wherein the plasma is not in direct contact with the workpiece. The process also includes sending an ion beam from the plasma-generating chamber towards a target within the depositing chamber, wherein the target includes a material, and depositing a layer of the material over the organic layer.

7 Claims, 4 Drawing Sheets

PROCESSES FOR FORMING ELECTRONIC DEVICES AND ELECTRONIC DEVICES FORMED BY SUCH PROCESSES

BACKGROUND OF THE INVENTION

1. Field of the Invention

The invention relates generally to processes and electronic devices, and more specifically, to processes for forming electronic devices and electronic devices formed by the processes.

2. Description of the Related Art

Electronic devices continue to be more extensively used in everyday life. Examples of electronic devices include Organic Light-Emitting Diodes ("OLEDs"). OLEDs include multilayer stacks of organic and inorganic layers. One or more organic layers are very sensitive to damage that can occur during deposition of one or more inorganic layers (e.g., one or more metal-containing layers, one or more insulating layers, or any combination thereof) after the organic layer(s) have been formed. Plasma-intensive processing using conventional magnetron sputtering or using an S-gun during sputtering can cause loss of efficiency and lifetime of the OLED due to the detrimental effects of charged particles, radiation, or both reaching the underlying organic layer(s).

Figure 1:
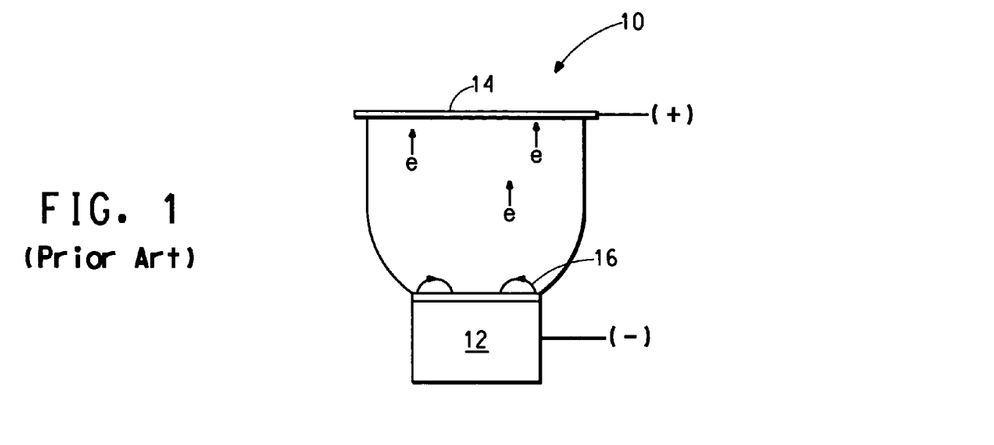
FIG. 1 includes an illustration of a portion of a magnetron sputtering apparatus. (Prior art).

A magnetron sputtering apparatus 10 is by far the most common sputtering technique used for depositing inorganic films. The magnetron sputtering apparatus includes a target 12 and a workpiece 14. The target 12 is maintained at relatively negative potential compared to the workpiece 14. An inert gas, such as Ar, is provided. In the presence of the electrical field, $Ar^+$ and electrons are produced to create a plasma 16. The $Ar^+$ are attracted to the target 12, from which material is displaced and deposited onto the workpiece 14. Electrons are attracted to the workpiece 14. Magnets (not illustrated) are used to confine the plasma 16 between the target 12 and workpiece 14. As can be seen in FIG. 1, the workpiece is in direct contact with the plasma 16 and is constantly being bombarded by charged particle during deposition.

In another attempt to reduce the adverse effects of sputtering, lighter gasses have been proposed. For example, referring to FIG. 1, $Ne^+$ would be substituted for $Ar^+$. Still, the workpiece 14 is in direct contact with the plasma 16 and charged particles, especially electrons are still hitting the workpiece 14, and causing plasma damage.

Figure 2:
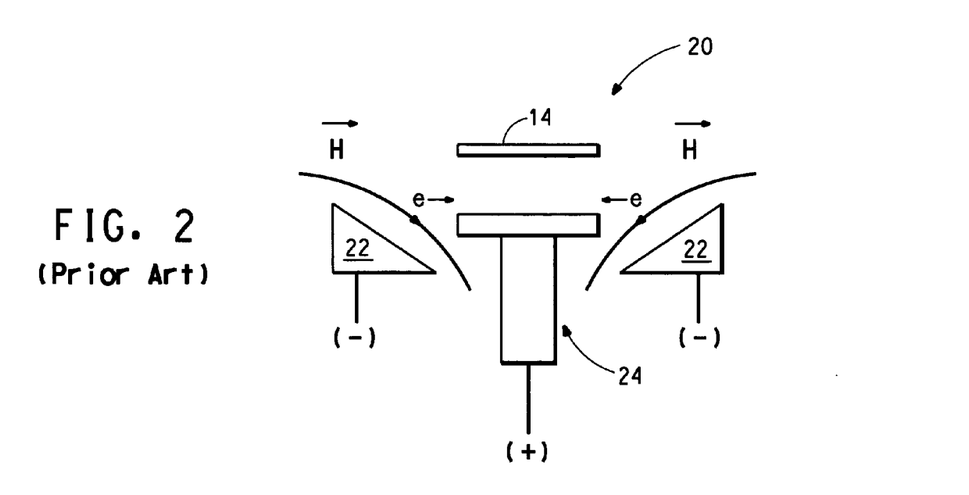
FIG. 2 includes an illustration of a portion of an S-gun used in a sputtering apparatus. (Prior art).

FIG. 2 includes an illustration of an S-gun configuration that can be used when sputtering. In this configuration, the workpiece 14 is removed from the electrical circuit. The anode 24 and cathode 22 are separate from the workpiece 14. While the S-gun configuration helps reduce plasma damage to the workpiece 14, a large number of charged particles, especially electrons, still hit the workpiece 14 during deposition.

SUMMARY OF THE INVENTION

A process for forming an electronic device includes forming a first layer over a substrate, wherein the first layer includes an organic layer, and depositing a second layer over the substrate after forming the first layer, wherein depositing the second layer is performed using ion beam sputtering.

In another embodiment, a process for forming an electronic device includes placing a workpiece within a depositing chamber of a depositing apparatus, wherein the workpiece includes a substrate and an organic layer overlying the workpiece. The process includes generating a plasma within a plasma-generating chamber of the depositing apparatus, wherein the plasma is not in direct contact with the workpiece. The process also includes sending an ion beam from the plasma-generating chamber towards a target within the depositing chamber, wherein the target includes a material, and depositing a layer of the material over the organic layer.

The foregoing general description and the following detailed description are exemplary and explanatory only and are not restrictive of the invention, as defined in the appended claims.

BRIEF DESCRIPTION OF THE FIGURES

The invention is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A process for forming an electronic device includes forming a first layer over a substrate, wherein the first layer includes an organic layer, and depositing a second layer over the substrate after forming the first layer, wherein depositing the second layer is performed using ion beam sputtering.

In one embodiment, the organic layer comprises an organic active layer. In a specific embodiment, the first layer further includes a buffer layer, a charge-blocking layer, a charge-injection layer, a charge-transport layer, or a combination thereof.

In another embodiment, the second layer includes an inorganic layer. In still another embodiment, the second layer includes a conductive layer. In a specific embodiment, the electronic device includes an LED having an anode and a cathode and the second layer is at least part of the anode or the cathode.

In a further embodiment, depositing the second layer includes depositing the second layer directly onto the organic layer. In still another embodiment, the second layer includes an insulating layer. In yet another embodiment, the organic layer is at least part of an electronic component within the electronic device. In a still further embodiment, an electronic device is formed by the process.

In one embodiment, a process for forming an electronic device includes placing a workpiece within a depositing chamber of a depositing apparatus, wherein the workpiece includes a substrate and an organic layer overlying the workpiece. The process includes generating a plasma within a plasma-generating chamber of the depositing apparatus, wherein the plasma is not in direct contact with the workpiece. The process also includes sending an ion beam from the plasma-generating chamber towards a target within the depositing chamber, wherein the target includes a material, and depositing a layer of the material over the organic layer.

In another embodiment, sending the ion beam includes extracting ions from the plasma to form an ion beam. In another embodiment, sending the ion beam includes accelerating ions within the ion beam. In still another embodiment, placing the workpiece includes placing the workpiece, such that the workpiece does not lie along a line defined by a principal deflected angle. In a specific embodiment, the organic layer includes an organic active layer. In a more specific embodiment, the organic layer further includes a buffer layer, a charge-blocking layer, a charge-injection layer, a charge-transport layer, or a combination thereof.

In still another embodiment, the layer of the material includes a conductive layer. In a specific embodiment, the electronic device includes an LED having an anode and a cathode, and the layer of the material is at least part of the anode or the cathode.

In a further embodiment, the layer of the material includes an insulating layer. In yet another embodiment, an electronic device is formed by the process.

Other features and advantages of the invention will be apparent from the following detailed description, and from the claims. The detailed description first addresses Definitions and Clarification of Terms followed by, Processes for Forming an Electronic Device, Alternative Embodiments, and Advantages.

1. Definitions and Clarification of Terms

Before addressing details of embodiments described below, some terms are defined or clarified. The terms "array," "peripheral circuitry," and "remote circuitry" are intended to mean different areas or components of an electronic device. For example, an array may include pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "buffer layer" or "buffer material" is intended to mean one or more electrically conductive layers or materials, one or more semiconductive layers or materials, or any combination thereof that may provide or serve one or more functions in an electronic device, including planarization of the underlying layer, one or more charge transport or charge injection properties, scavenging of one or more impurities, such as oxygen, a metal ion, or a combination thereof, or another aspect to facilitate or to improve the performance of the electronic device. A buffer material may be a polymer, a solution, a dispersion, a suspension, an emulsion, a colloidal mixture, another composition, or any combination thereof.

The term "charge-blocking," when referring to a layer, material, member, or structure, is intended to mean such layer, material, member or structure reduces the likelihood that a charge migrates into another layer, material, member or structure.

The term "charge-injecting," when referring to a layer, material, member, or structure, is intended to mean such layer, material, member or structure promotes charge migration into an adjacent layer, material, member or structure.

The term "charge-transport," when referring to a layer, material, member, or structure is intended to mean such layer, material, member, or structure facilitates migration of such charge through the thickness of such layer, material, member, or structure with relative efficiency and small loss of charge.

The term "conductive," when referring to a layer or a material, is intended to mean that the layer or material allows a significant current to flow through the material without a significant drop in voltage when passing through the layer or material.

The term "depositing apparatus" is intended to mean one or more equipment, system or subsystem, or any combination thereof designed for a depositing one or more layers of one or more materials over a workpiece. A depositing apparatus may have one or more depositing chambers.

The term "depositing chamber" is intended to mean a portion of a depositing apparatus where depositing is designed to actually occur. The depositing chamber may be partially or completely enclosed.

The term "electronic device" is intended to mean a collection of circuits, electronic components, or combinations thereof that collectively, when properly connected and supplied with the appropriate potential(s), performs a function. An electronic device may include or be part of a system. An example of an electronic device include a display, a sensor array, a computer system, an avionics system, an automobile, a cellular phone, another consumer or industrial electronic product, or the like.

The term "insulating" and its variants are intended to mean a material, layer, member, or structure having an electrical property such that it substantially prevents a significant number of charge carriers from flowing through such material, layer, member or structure.

The term "ion beam" is intended to mean ions that are extracted from a plasma and sent as a beam towards a target or other location.

The term "ion beam sputter," and its variants, are intended to mean an operation in which ions within a plasma are extracted from the plasma and sent as an ion beam towards a target, from which material within the target is displaced and is then deposited on an exposed surface of a workpiece.

The term "organic active layer" is intended to mean one or more organic layers, wherein at least one of the organic layers, by itself, or when in contact with a dissimilar material is capable of forming a rectifying junction.

The term "plasma" is intended to mean an ionized gas.

The term "plasma-generating chamber" is intended to mean a portion of all of an apparatus in which a plasma is generated or maintained. A plasma-generating chamber may lie partially within or completely outside of a depositing chamber or an etching chamber.

The term "principal deflected angle" is intended to mean an angle that is used to characterize an ion beam after it is deflected by a surface.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is an example of a radiation-emitting component.

The term "radiation-responsive component" is intended to mean an electronic component can sense or otherwise respond to radiation at a targeted wavelength or spectrum of wavelengths. The radiation may be within the visible-light spectrum or outside the visible-light spectrum (UV or IR). A photodetector, an IR sensor, a biosensor, or a photovoltaic cell is an example of a radiation-responsive component.

The term "rectifying junction" is intended to mean a junction within a semiconductor layer or a junction formed by an interface between a semiconductor layer and a dissimilar material, in which charge carriers of one type flow easier in one direction through the junction compared to the opposite direction. A pn junction is an example of a rectifying junction that can be used as a diode.

The term "substrate" is intended to mean a base material that can be either rigid or flexible and may include one or more layers of one or more materials, which can include glass, polymer, metal or ceramic materials or combinations thereof. The reference point for a substrate is the beginning point of a process sequence. The substrate may or may not include electronic components, circuits, or conductive members.

The term "workpiece" is intended to mean a substrate at any particular point of a process sequence. Note that the substrate may not significantly change during a process sequence, whereas the workpiece significantly changes during the process sequence. For example, at a beginning of a process sequence, the substrate and workpiece are the same. After a layer is formed over the substrate, the substrate has not changed, but now the workpiece includes the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Group numbers corresponding to columns within the Periodic Table of the elements use the "New Notation" convention as seen in the *CRC Handbook of Chemistry and Physics*, 81$^{st}$ Edition (2000).

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the organic light-emitting diode display, photodetector, photovoltaic, and semiconductor arts.

2. Processes for Forming an Electronic Device

Figure 3:
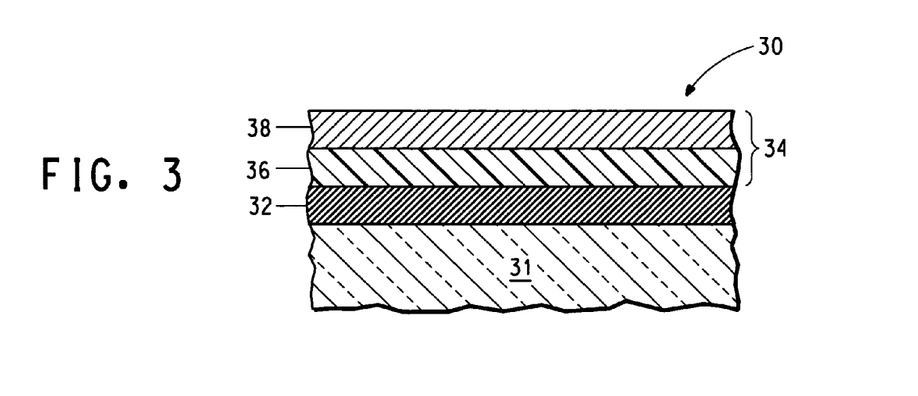
FIG. 3 includes an illustration of a cross-sectional view of a portion of a workpiece after forming a first electrode layer and an organic layer over a substrate.

Attention is now directed to processes for forming an electronic device. FIG. 3 includes an illustration of a portion of a workpiece 30. The workpiece 30 includes a substrate 31 that can be rigid or flexible and may contain one or more layers of an organic, inorganic, or both organic and inorganic materials. In one embodiment, the electronic device includes a bottom emission display, and the substrate 31 includes a transparent material that allows at least 70% of the radiation incident on the substrate 31 to be transmitted through it. Although not shown, the substrate 31 may include circuits for operating the electronic device. Such circuitry is conventional. At locations not shown, openings to contacts for the circuits allow subsequently-formed conductive layers, members, or structures to be electrically connected to those circuits.

A first electrode layer 32 is formed over the substrate 31. The first electrode layer 32 can include nearly any conductive material. In this specific embodiment, the first electrode layer 32 will be used for anodes for the electronic device being formed. In general, the material of the first electrode layer 32 forms the anodes, which will have a work function relatively higher than subsequently-formed conductive members that act as the cathodes. A plurality of conductive layers may be formed to create the first electrode layer 32. In this particular embodiment, the first electrode layer 32 lies between the user side of the electronic device and the subsequently-formed organic active layer. Therefore, first electrode layer 32 should be transparent to allow the radiation to be transmitted through the first electrode layer 32. An exemplary material includes indium tin oxide ("ITO"), zinc tin oxide ("ZTO"), an elemental metal, a metal alloy, or any combination thereof. ITO and ZTO may be thicker when used as the first electrode layer 32 and still allow sufficient transmission of radiation. For example, when ITO or ZTO is used as the first electrode layer 32, the first electrode layer 32 may have a thickness in a range of approximately 100 to 200 nm.

In one embodiment, the first electrode layer 32 can be formed using a conventional deposition and optional patterning sequence. For example, the first electrode layer 32 can be deposited as a patterned layer using a stencil mask. In another embodiment, the first electrode layer 32 may be deposited over the substrate 31 and patterned using a conventional lithographic process. After reading the specification, skilled artisans will appreciate that many other techniques may be used in forming the first electrode layer 32.

Although not illustrated, one or more optional substrate structures can be formed over the substrate 31. Such optional substrate structures are conventional and can include well structures, cathode separators, or the like.

An organic layer 34 is formed over the first electrode layer 32. The organic layer 34 may include one or more layers. The organic layer 34 includes an organic active layer 38, and optionally, may contain any one or more of a buffer layer, charge-injection layer, a charge-transport layer, a charge-blocking layer, or any combination thereof. The optional buffer, charge-injection layer, charge-transport layer, charge-blocking layer, or any combination thereof may lie a between the organic active layer 38 and the first electrode layer 32, between the organic active layer 38 and a subsequently-formed second electrode layer, or a combination thereof. In one embodiment, a hole-transport layer 36 lies between the first electrode layer 32 and the organic active layer 38.

The formation of the organic layer 34 is performed using any one or more conventional deposition techniques used in forming organic layers in OLEDs. In one embodiment, the hole-transport layer 36 can include an organic polymer, such as polyaniline ("PANI"), poly(3,4-ethylenedioxythiophene) ("PEDOT"), or an organic charge transfer compound, such as tetrathiafulvalene tetracyanoquinodimethane (TTF-TCQN). The hole-transport layer typically has a thickness in a range of approximately 50 to 250 nm.

The organic active layer 38 can include one or more small molecule materials, one or more polymeric materials, or a combination thereof. Small molecule materials may include those described in, for example, U.S. Pat. Nos. 4,356,429 and 4,539,507. Alternatively, polymeric materials may include those described in U.S. Pat. Nos. 5,247,190, 5,408,109, and 5,317,169. An exemplary material is a semiconducting conjugated polymer. An example of such a polymer is poly (phenylenevinylene) referred to as "PPV." The light-emitting material may be dispersed in a matrix of another material, with or without an additive, but typically form a layer alone. In one embodiment, the organic active layer 38 generally has a thickness in the range of approximately 40 to 100 nm.

When the organic active layer 38 is incorporated into a radiation-receiving electronic device, the material(s) of the organic active layer 38 may include one or more conjugated polymers, one or more electroluminescent materials, or a combination thereof. Such materials include for example, many conjugated polymers and electro- and photo-luminescent materials. A specific example includes poly(2-methoxy, 5-(2-ethyl-hexyloxy)-1,4-phenylene vinylene) ("MEH-PPV") or a MEH-PPV composite with CN-PPV. The organic active layer 34 typically has a thickness in a range of approximately 50 to 500 nm.

In one embodiment, only one organic active layer 38 is used in the array. In another embodiment, different organic active layers may be used in different parts of the array. For example, for a full-color display, different materials for the organic active layers can be used to achieve red, green, and blue light-emitting components.

Figure 4:
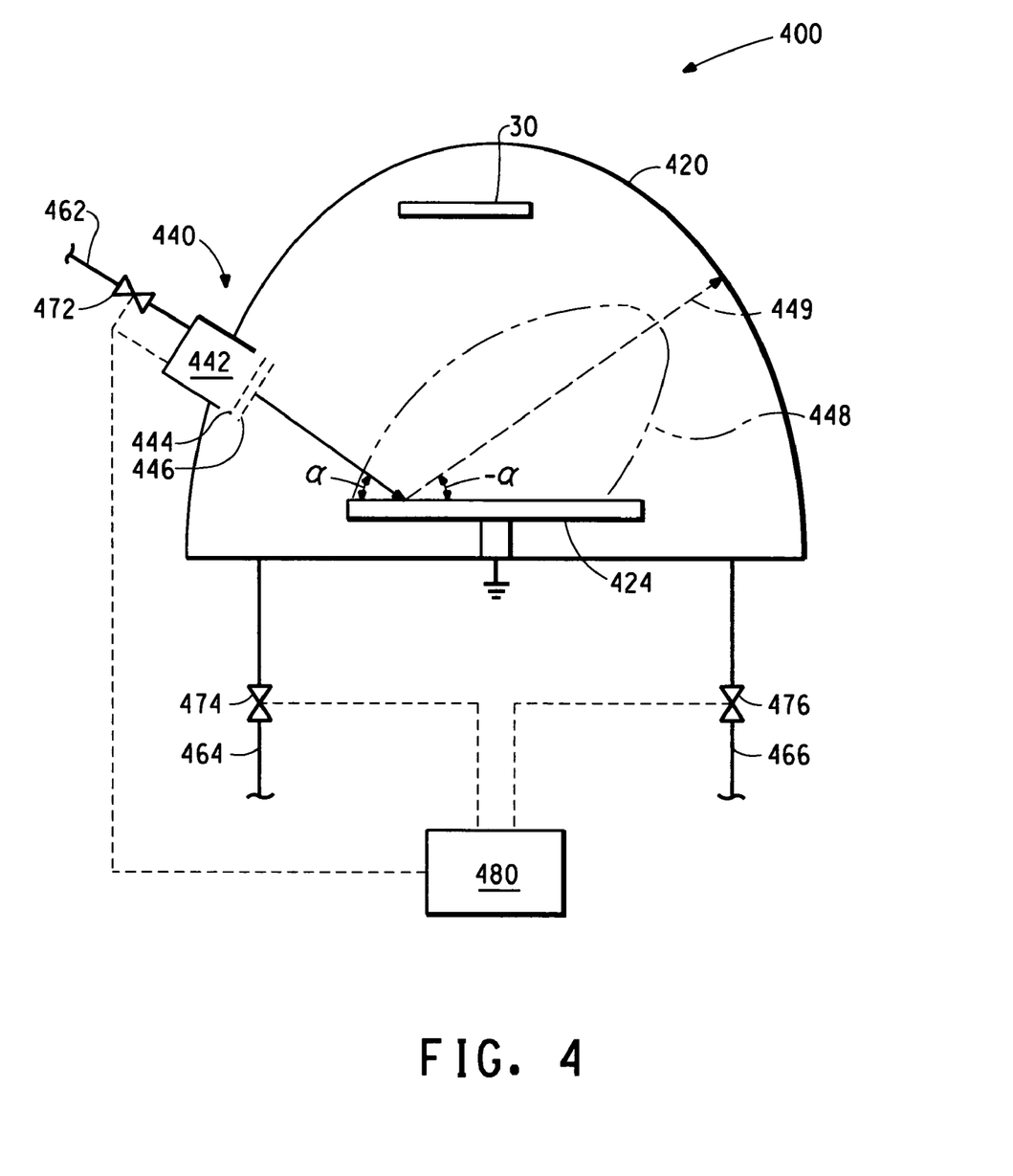
FIG. 4 includes an illustration of a depositing apparatus that includes a workpiece that has been placed within the depositing chamber.

The workpiece 30 is then placed within a depositing chamber 420 of a depositing apparatus 400. In one embodiment, the depositing apparatus 400 is an ion-beam sputtering apparatus. The depositing chamber 420 also includes a target 424. The target 424 includes one or more materials that are to be deposited onto an exposed surface of the workpiece 30. The workpiece 30 is oriented such that the organic layer 34 faces the target 424. The target 424 is electrically connected to ground.

An ion beam gun 440 is used to generate an ion beam. A plasma can be generated within the ion beam gun 440 in one or more of several different ways. For example, the plasma can be created by microwaves, radio frequency waves, thermionic emission (e.g., a filament anode), created by using a Kaufman source, or another conventional method.

In one embodiment, the ion beam gun 440 includes a plasma-generating chamber 442, a beam grid 444, and an accelerating grid 446 (also called a suppression grid). In another embodiment, more or fewer grids can be used. In a specific embodiment, no grid is used. The ions leaving the ion beam gun 440 and before reaching the target are referred to as primary ions. The primary ions have sufficient kinetic energy to enter the material and collide inside the material in a cascade collision process. The atoms, molecules, or both within the target 424 are shaken up by the primary ions entering into the material of the target 424. Part of the material within the target 424 becomes dislodged and deposits onto the exposed surface of the workpiece 30 and on one or more walls of the depositing chamber 420.

Some primary ions are deflected by the target 424. Also, additional ions can be generated from the material within the target 424 when electrons are stripped from the atoms or molecules of the material within the target 424. The deflected primary ions and additional ions, are collectively referred to as secondary ions. The secondary ions have a distribution 448 that can be characterized by a modified cosine distribution along a principal deflected angle $-\alpha$. A line 449, which is defined by the principal deflected angle $-\alpha$, extends towards a wall of the depositing chamber 420. As illustrated in FIG. 4, the workpiece 30 is placed into the chamber so that it does not contact or otherwise lie along the line 449.

The depositing apparatus 400 also includes a gas inlet 462 and a corresponding valve 472, a first outlet 464 and a corresponding valve 474, and a second outlet 466 and a corresponding valve 476. In one embodiment, the first outlet 464 can be connected to a roughing pump used to reduce the pressure within the depositing chamber 420 and plasma generation chamber 442 to a first vacuum pressure. The second outlet 466 can be connected to a diffusion or cryogenic pump to further reduce the pressure within the depositing chamber 420 and the plasma-generating chamber 442. In another embodiment, more gas inlets, more or fewer outlets, or a combination thereof may be used. For example, a gas inlet may be placed to allow gas to enter the chamber 420 without first entering the plasma chamber 442. A controller 480 controls the operations of the depositing apparatus 400 including the valves 472, 474, 476 and the ion beam gun 440, including supplying the potentials for the beam grid 444 and the accelerating grid 446.

After the workpiece 30 is placed into the depositing chamber 420, the depositing chamber 420 is pumped down using the valve 474 and outlet 464 connected to the roughing pump. After a predetermined pressure is reached, the controller 480 shuts off the valve 474 and opens the valve 476 to the second outlet 466 that is connected to a diffusion or cryogenic pump. The pump down continues until a baseline pressure is reached. The controller 480 sends a signal to the gas inlet valve 472 to allow a gas to flow through the inlet 462 to the plasma-generating chamber 442. The gas can include a noble gas (e.g., He, Ne, Ar, Xe, Rn, or a combination thereof) or other gas, such as $N_2$, $O_2$, or any combination of such noble or other gases. The controller 480 adjusts the pressure in the depositing chamber 420 and plasma-generating chamber 442 by adjusting the valves 472 and 476. In one embodiment, the pressure is less than 10 mTorr, and in a specific embodiment, the pressure is in a range of approximately 0.001 to 1 mTorr.

The controller 480 adjusts the electrical field within the plasma-generating chamber 442 to create a plasma from the gas entering the plasma-generating chamber 442 from the gas inlet 462. The plasma can include ions, electrons, and neutral species. In one embodiment, the positively charged species can include $He^+$, $Ne^+$, $Ar^+$, $Xe^+$, $Rn^+$, $N^+$, or a combination thereof. In one embodiment, the beam grid 444 is at a positive voltage with respect to ground, and the accelerating grid 446 is at a negative voltage with respect to ground. The actual values used for the voltages of the beam grid 444 and the accelerating grid 446 are conventional. Although not illustrated, a collimator can be used to reduce the amount of scatter of ions once they leave the ion beam gun 440. Additional electronics or one or more magnets (not illustrated) can be used to further focus the ion beam.

The primary ions hit the target 424 at an incident angle α. As previously described, some primary ions from the ion beam have sufficient kinetic energy to enter into the target 424 to help dislodge material from the target 424 that is deposited onto the workpiece 30 and one or more walls of the depositing chamber 420. The secondary ions can travel as characterized by the distribution 448 and the principal deflected angle −α. However, as previously described, the workpiece 30 is placed so that it does not contact or lie along the line 449. In this manner, damage from charged particles hitting the workpiece 30, and especially the organic layer 34, is substantially eliminated.

The deposition continues until a desired thickness of the material is deposited as a layer onto the exposed surface of the workpiece 30. Although not illustrated, the workpiece 30 may be attached to a chuck or other holder that optionally allows the workpiece 32 rotated or heated during the deposition. In one embodiment, the stress of the deposited layer is no greater than $5 \times 10^9$ dynes/cm$^2$.

After the deposition is completed, the controller 480 shuts off the valve 476 and electronics used to generate the plasma, operate the beam grid 444 or accelerating grid 446, or any combination thereof. The controller 480 then adjusts the gas inlet valve 472 to allow the depositing chamber 420 to reach substantially atmospheric pressure. A gas used to backfill the depositing chamber 420 may be the same or different from the gas used to form the ion beam. In one embodiment, Xe is used for the plasma, and $N_2$ is used for backfilling the depositing chamber 420. The workpiece 30 is then removed from the depositing chamber 420.

The depositing apparatus 400 can include additional depositing chambers 420 and other equipment similar to what is illustrated in FIG. 4. When multiple depositing chambers 420 are present within the depositing apparatus 400, the workpiece 30 may be transferred between depositing chambers 420 without breaking vacuum. Such a depositing apparatus 400 can be useful when depositing a relatively reactive material (e.g., a Group 1 or Group 2 metal) onto the workpiece 30 before depositing other less reactive materials.

Figure 5:
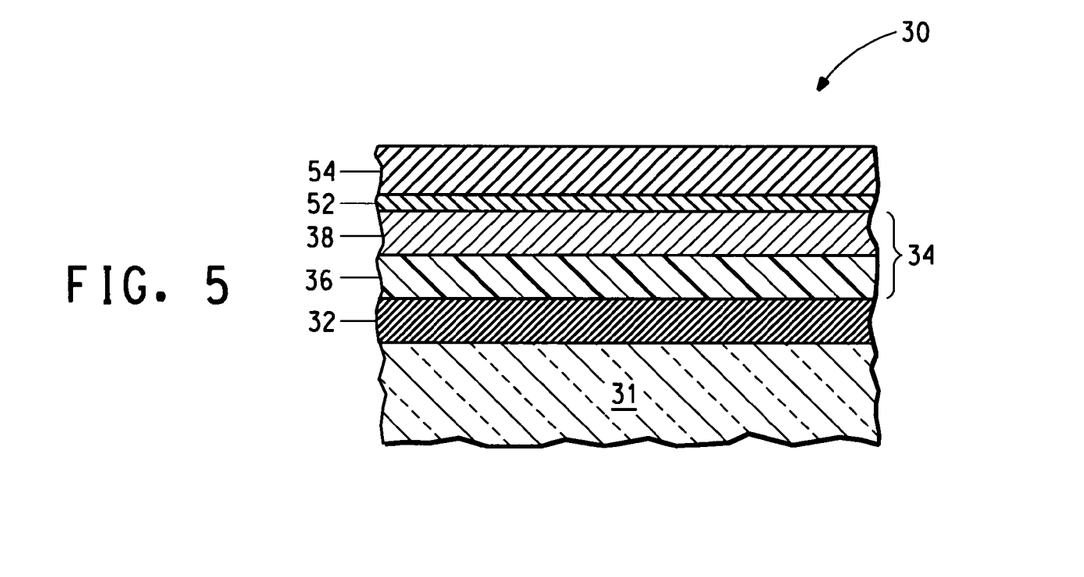
FIG. 5 includes an illustration of a cross-sectional view of the workpiece including an organic layer after forming second electrode layers using ion beam sputtering.

Referring to FIG. 5, one or both of layers 52 and 54 are deposited using the depositing apparatus 400. In one embodiment, each of the layers 52 and 54 is an inorganic layer, and in a more specific embodiment, each of layers 52 and 54 is a conductive, metal-containing layer. Layer 52 includes a metal-containing layer having a lower work function as compared to the first electrode layer 32.

The layer 52 can be selected from Group 1 metals (e.g., Li, Cs), the Group 2 (alkaline earth) metals, the rare earth metals including the lanthanides and the actinides, and any combination thereof. The layer 52 has a thickness in a range of approximately 1 to 30 nm. The layer 54 can include at least one element selected from Groups 4 to 6, 8 and 10 to 14 of the Periodic Table, and mixtures thereof. In one embodiment, layer 54 can include Cu, Al, Ag, Au, Mo, Cr, Ti, Ru, Ta, W, Si, or any combination thereof. In one embodiment, the layer 54 has a thickness in a range of approximately 100 to 2000 nm. In one specific, non-limiting embodiment, a Ba layer of less than approximately 10 nm is deposited followed by an Al layer of approximately 500 nm is deposited.

Either or both of layers 52 and 54 may be deposited as a patterned layer (e.g., using one or more stencil masks, not illustrated) or be deposited over substantially all of the workpiece 30 or a portion thereof, for example an array of electronic components (e.g., OLEDs or sensors), and subsequently patterned using a conventional lithographic process.

In one embodiment, the layers 52 and 54 are used to form second electrodes (e.g., cathodes) for the electronic device being formed.

In an alternative embodiment, one of the layers 52 and 54 is deposited using the depositing apparatus 400, and the other layer is deposited using a conventional process, such as evaporation.

Other circuitry not illustrated in FIG. 5 may be formed using any number of the previously described or additional layers. Although not shown, additional insulating layer(s) and interconnect level(s) may be formed to allow for circuitry in peripheral areas (not shown) that may lie outside the array. Such circuitry may include row or column decoders, strobes (e.g., row array strobe, column array strobe), or sense amplifiers.

Figure 6:
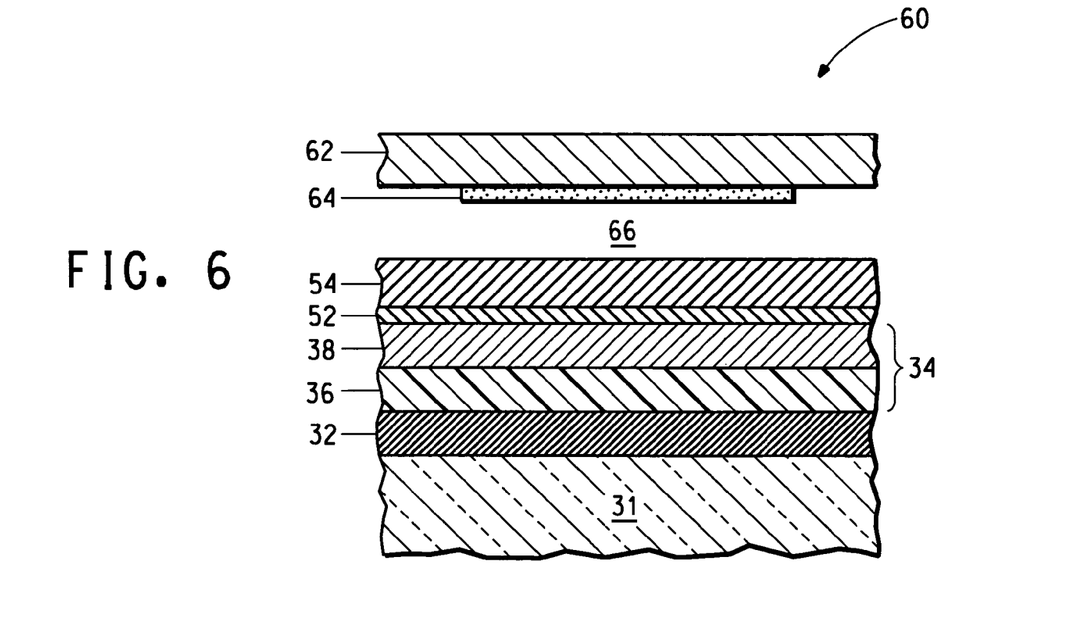
FIG. 6 includes an illustration of a cross-sectional view of a substantially completed electronic device.

A lid 62 with a desiccant 64 is attached to the substrate 31 at locations (not illustrated) outside the array to form a substantially completed electronic device 60 as illustrated in FIG. 6. A gap 66 may or may not lie between the layer 54 and the desiccant 64. The materials used for the lid and desiccant and the attaching process are conventional.

3. Alternative Embodiments

The electronic device described above can include a display (passive matrix or active matrix) with radiation-emitting components, such as OLEDs. Other embodiments can include other electronic devices with one or more organic layers that need an inorganic layer to be formed over the organic layer(s). Those other electronic devices can have radiation-responsive components, such as a sensor array, photovoltaic cell, other similar electronic components, or any combination thereof. The concepts may also be extended for use in another electronic device where an organic layer forms part of an electronic component, for example, a liquid crystal display having organic resistors.

The processes described above can be used for processing an array of electronic components, such as a display or a sensor array. The areas of the workpiece 30 outside the array, such as one or more areas for peripheral circuitry, remote circuitry, or a combination thereof may or may not be exposed to the same processing conditions as the array. For example, circuits for peripheral circuitry, remote circuitry, or a combination thereof may be formed before forming the first electrode layer 32. Such circuits may be covered by one or more insulating layers to help protect such circuits during subsequent processing when forming the first electrode layer 32 and other subsequently-formed layers as illustrated in FIGS. 3, 5, and 6. In one embodiment, a stencil mask can be used when forming the layers 52 and 54 to substantially prevent the layers 52 and 54 from being depositing onto undesired areas of the workpiece 30, such as a portion or all of the area for the peripheral circuitry, remote circuitry, or a combination thereof.

In still another embodiment, the order of the layers may be reversed. In this embodiment, the anodes and cathodes are effectively reversed. The layer 54 lies closest to the substrate 31 as compared to the other layers as illustrated in FIGS. 5 and 6. Such a structure may be useful for a top emission electronic device. The first electrode layer 32 is sputtered using the depositing apparatus 400. The target 424 would include material for the first electrode layer 32, which in one embodiment, is ITO, ZTO, or a combination thereof. In this embodiment, the lid 62 allows at least 70% transmission through the lid for the radiation to be emitted by or received by electronic components within the electronic device. If the desiccant 64 does not transmit at least 70% of the radiation, it can be moved so that it does not cover the electronic components that are to emit or respond to the radiation. For a bottom emission device, if the cathode lies closer to the user side, it may need to be substantially transparent to radiation emitted or received by the electronic components. If different patterns are needed or desired for the layers 52 and 54, as compared to each other, different stencil masks for the layers 52 and 54 can be used.

In yet another embodiment, a top emission electronic device can be made without reversing the order of the layers. In a particular embodiment, layer 52, layer 54, or both may include additional layers. For example, layer 52 can include a first layer of a material as previously described in a prior embodiment, and further include a second layer. The second layer can include one or more transparent conductive materials similar to those described with respect to first electrode layer 32. An exemplary material includes indium tin oxide ("ITO"), zinc tin oxide ("ZTO"), an elemental metal, a metal alloy, or any combination thereof. ITO and ZTO may be thicker when used as the second layer within layer 52 and still allow sufficient transmission of radiation. For example, when ITO or ZTO is used as the second layer, the second layer may have a thickness in a range of approximately 100 to 200 nm. The positional relationship of the layers can be such that the layer 52 overlies the electronic components within the array, and the layer 54 is in the form of strips or a lattice overlying In a further embodiment, the layer 52 can include an organic salt including a Group 1 or Group 2 metal in place of or in conjunction with other layer(s) within the layer 52.

4. Advantages

Embodiments described above have benefits compared to conventional techniques. An inorganic layer can be sputtered over a workpiece while an organic layer is present within the workpiece without causing significant plasma damage or other damage from charged particles reaching the organic layer. The workpiece is not in direct contact with the plasma, like in magnetron sputtering. Also, the workpiece is not position close to high-energy electrons, as would occur with a conventional S-gun configuration.

Figure 7:
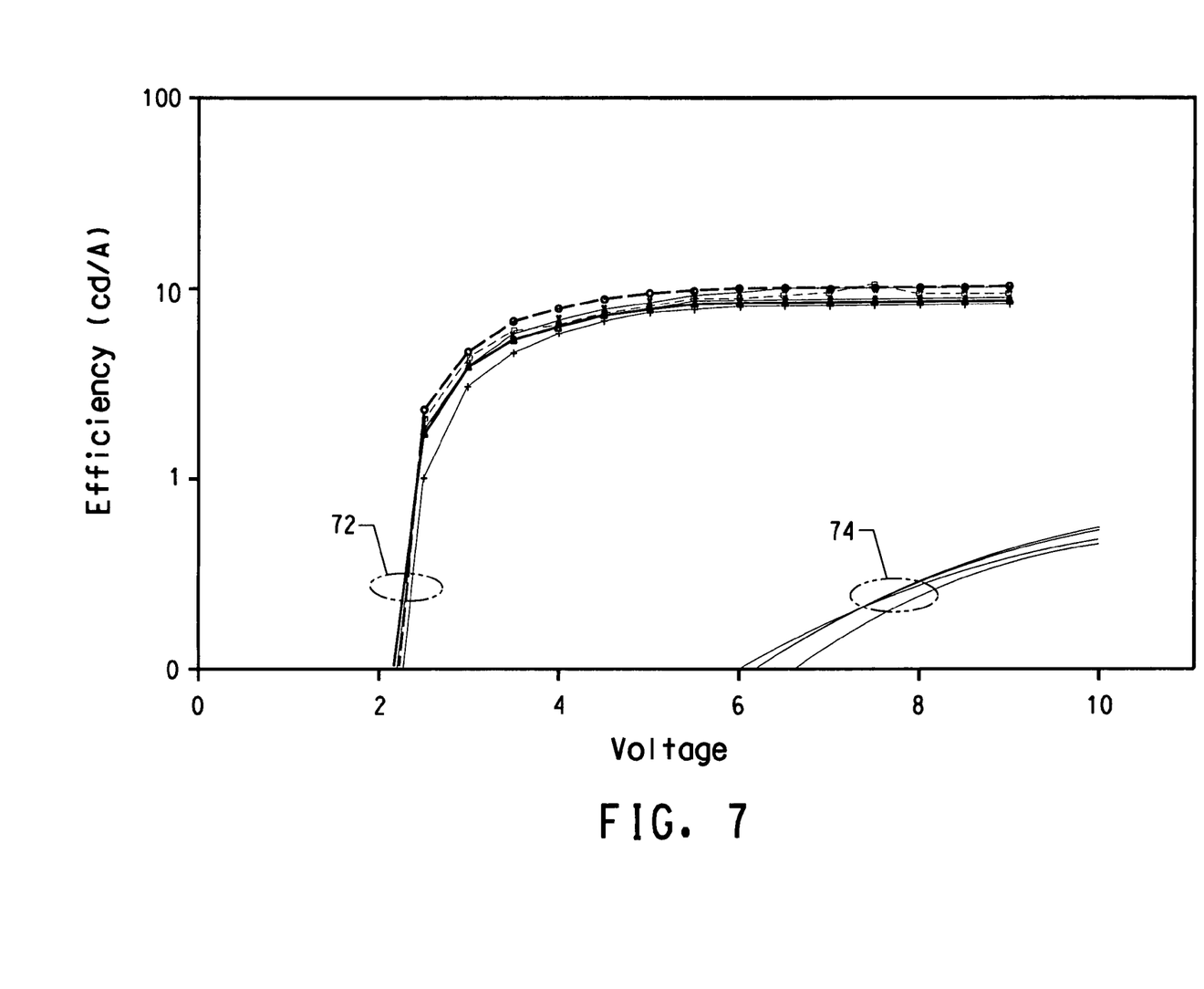
FIG. 7 includes a plot of efficiency as a function of voltage for radiation-emitting components.

The improvement in device performance is illustrated in FIG. 7, which includes a plot of efficiency of radiation-emitting components, specifically OLEDs in this embodiment, as a function of voltage. The organic active layer 38 is Covion Super Yellow™ polymer, which is a PPV-based polymer. Lines 72 in FIG. 7 correspond to radiation-emitting components when layers 52 and 54 are formed using ion beam sputtering. Lines 74 in FIG. 7 correspond to radiation-emitting components when layers 52 and 54 are formed using magnetron sputtering. The radiation-emitting components formed using ion beam sputtering have an improvement in efficiency compared to radiation-emitting components formed using magnetron sputtering.

An increased lifetime and a lower rate of degradation of the electronic components should occur because the electronic device can be operated at a lower voltage and still achieve a desired or targeted emission intensity. Similar effect may occur with radiation-responsive electronic components.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. A process for forming an electronic device comprising:
   forming a first layer over a substrate, wherein the first layer includes an organic layer; and
   depositing a second layer over the substrate after forming the first layer, wherein depositing the second layer is performed using ion beam sputtering;
   wherein the organic layer comprises an organic active layer.

2. The process of claim 1, wherein the first layer further comprises a buffer layer, a charge-blocking layer, a charge-injection layer, a charge-transport layer, or a combination thereof.

3. The process of claim 1, wherein the second layer includes a conductive layer.

4. The process of claim 3, wherein:
   the electronic device includes an LED having an anode and a cathode; and
   the second layer is at least part of the anode or the cathode.

5. The process of claim 1, wherein the second layer includes an inorganic layer and an insulating layer.

6. The process of claim 5, wherein depositing the second layer comprises depositing the second layer directly onto the organic layer.

7. The process of claim 1, wherein the organic layer is at least part of an electronic component within the electronic device.

* * * * *